United States Patent
Shirasaki

(10) Patent No.: US 7,968,252 B2
(45) Date of Patent: Jun. 28, 2011

(54) PELLICLE FRAME

(75) Inventor: Toru Shirasaki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 225 days.

(21) Appl. No.: 12/204,257

(22) Filed: Sep. 4, 2008

(65) Prior Publication Data
US 2009/0068573 A1    Mar. 12, 2009

(30) Foreign Application Priority Data
Sep. 5, 2007 (JP) ................. 2007-230289

(51) Int. Cl.
G03F 1/00 (2006.01)
B32B 1/00 (2006.01)
(52) U.S. Cl. .......................... 430/4; 428/34.1
(58) Field of Classification Search .............. 430/4–5
See application file for complete search history.

(56) References Cited

U.S. PATENT DOCUMENTS

| | | | |
|---|---|---|---|
| 6,885,436 B1* | 4/2005 | Berman et al. | 355/75 |
| 2005/0048376 A1* | 3/2005 | Eschbach et al. | 430/5 |
| 2006/0246234 A1 | 11/2006 | Meyers et al. | |
| 2009/0246644 A1* | 10/2009 | Chakravorty et al. | 430/5 |
| 2009/0286169 A1* | 11/2009 | Shirasaki | 430/5 |

FOREIGN PATENT DOCUMENTS

| | | |
|---|---|---|
| EP | 1898261 | 3/2008 |
| JP | 20061194777 | 5/2006 |

OTHER PUBLICATIONS

JPO Machine Translation of Kasuse JP-2006-199477 (previously cited without translation by Applicant on IDS).*
Fujita M. Et al. "Pellicle-induced distortions in advanced photomasks" Proceedings of the SPIE, SPIE, vol. 4754, Jul. 1, 2002, pp. 589-596 XP002464927, whole document.
Chinese Official Action dated Dec. 9, 2010, in corresponding Chinese Application No. 200810212835.8, and English translation in part.

* cited by examiner

Primary Examiner — Mark F Huff
Assistant Examiner — John Ruggles
(74) Attorney, Agent, or Firm — Lowe Hauptman Ham & Berner, LLP

(57) ABSTRACT

The present invention is directed to reduce pellicle frame distortions due to the tension of a pellicle film and caused during handling, thereby providing an excellent pellicle frame capable of reducing the distortion of a photomask due to a pellicle affixation. In the pellicle frame of the present invention, the frame consists of a plurality of layers of which at least one layer has a different elastic modulus. It is preferable to: make the pellicle frame compositely of a layer having an elastic modulus of 10 GPa or smaller and of a layer having an elastic modulus of 50 GPa or greater; join these layers of the pellicle frame in a direction perpendicular to the pellicle film face; laminate such that layers having a large elastic modulus form the outermost layer; or reverse this lamination structure.

4 Claims, 4 Drawing Sheets

PELLICLE FRAME

RELATED APPLICATIONS

Figure 1:
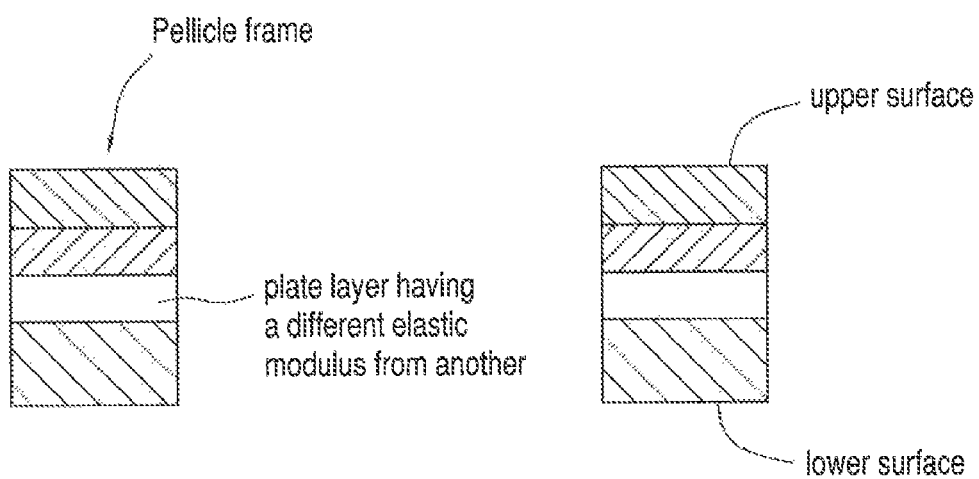
Figure 2:
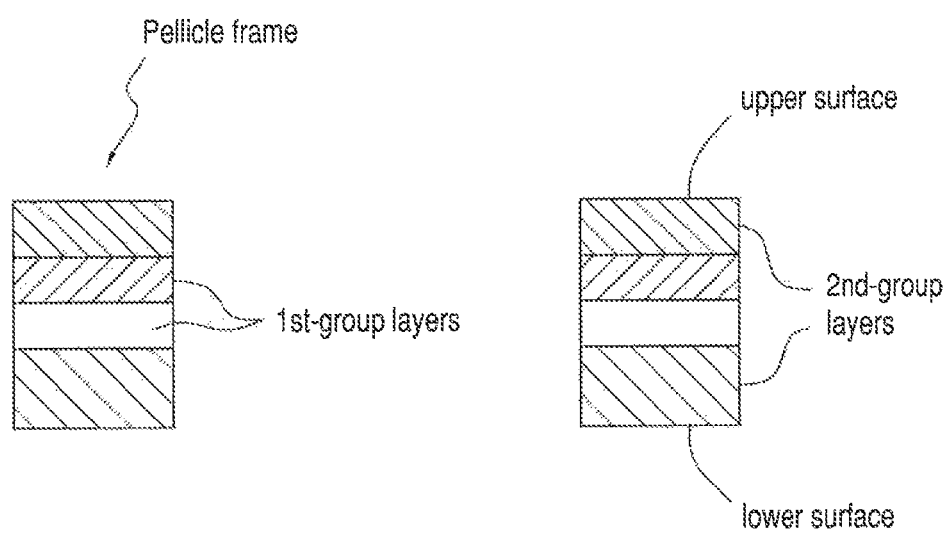
Figure 3:
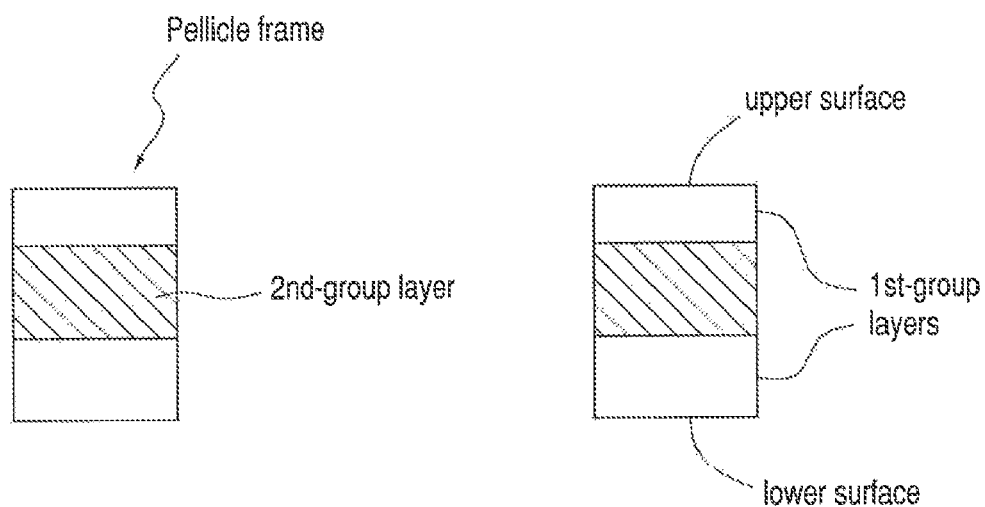
Figure 4:
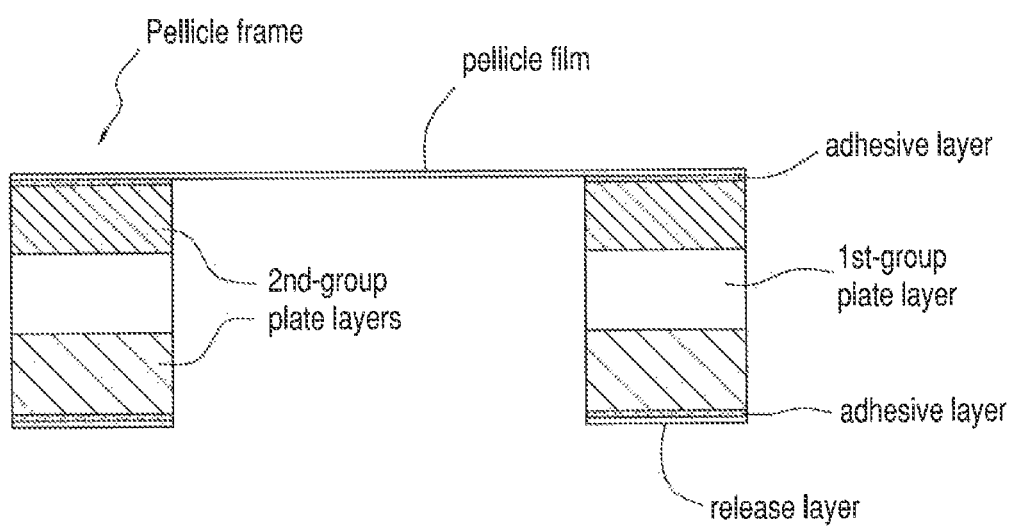

The present application is based on, and claims priority from, Japan Application Number 2007-230289, filed Sep. 5, 2007, the disclosure of which is hereby incorporated by reference herein in its entirety.

BACKGROUND OF THE INVENTION

1. Field of the Invention

The present invention relates to a lithographic pellicle, in particular to a lithographic pellicle used as dust-proof protection in the manufacture of semiconductor devices such as LSI or ultra-LSI. More particularly, the invention relates to a lithographic pellicle used for ultraviolet exposure light of 200 nm or shorter wavelength used for patterning light exposure which requires high resolution.

2. Description of the Related Art

Conventionally, the manufacture of semiconductor devices such as LSI and ultra-LSI, or liquid crystal display panels and the like, has involved employing procedures such as lithography for the patterning of semiconductor wafers or liquid crystal original plates through irradiation of light. However, there is a problem that any dust adhering to the employed original plate absorbs and reflects light, which deforms and roughens the edges of the replicated patterning, thereby detracting from dimensions, quality, and appearance, and impairing the performance of the semiconductor device and/or liquid crystal display panel, while reducing the manufacturing yield thereof.

Thus, these operations are ordinarily carried out in clean rooms, but keeping exposure original plates clean at all times in such clean rooms is difficult, and hence pellicles having good light transmissivity are adhered, as dust-proof protection, to the surface of exposure original plates. The advantage of the pellicle is that dust does not attach directly to the surface of the exposure original plate, but becomes adhered to the pellicle membrane, so that if focus is in accord with the pattern of the exposure original plate during lithography, transfer is not affected by dust on the pellicle.

The pellicle is made up of a pellicle frame comprising aluminum, stainless steel or the like, a transparent pellicle membrane adhered on the upper surface of the pellicle frame, comprising nitrocellulose, cellulose acetate or the like having good light transmissivity, an adhesive layer coated on the lower surface of the pellicle frame, and a release layer (separator) adhered on the adhesive layer. The adhesive bonding between the pellicle frame and pellicle membrane is carried out by coating a good solvent for the pellicle membrane material and then air-drying the solvent (Japanese Patent Application Laid-open No. S58-219023) or using an adhesive agent such as an acrylic resin, epoxy resin or the like (U.S. Pat. No. 4,861,402, Japanese Patent Examined Application Publication No. S63-27707, Japanese Unexamined Patent Application Laid-open No. H07-168345).

As a result of ever higher lithography resolutions encountered in recent years, the employed light sources are gradually shifting to shorter wavelengths in order to realize such resolutions. Specifically, there has been a shift towards g-line (436 nm), i-line (365 nm), KrF excimer lasers (248 nm) in ultraviolet light, while ArF excimer lasers (193 nm) have begun to be used recently.

SUMMARY OF THE INVENTION

In a semiconductor exposure device, the pattern drawn on a photomask is burned into the photoresist on a silicon wafer by way of short-wavelength light. Irregularities on the photomask and the silicon wafer give rise however to focal shift, which impairs the pattern printed onto the wafer. The required flatness from photomasks and silicon wafers is getting more stringent as the patterning becomes finer and finer. For instance, the required flatness from photomasks is becoming gradually more demanding, from a flatness of 2 μm at the pattern plane, down to 0.5 μm and 0.25 μm for the 65 nm node and beyond.

Pellicles are affixed onto finished photomasks as dust-proof protection of the latter. However, the flatness of a photomask may change upon affixing of a pellicle on the photomask. Deficient photomask flatness can give rise to problems such as the above-described focal shift. Changes in flatness alter the shape of the pattern drawn on the photomask and give rise also to problems as regards focal displacement on the photomask.

In contrast, photomask flatness may be improved by pellicle affixing. Although in this case focal shift is not a problem, pattern shape changes still give rise to problems as regards focal displacement on the photomask.

In leading-art photomasks, thus, photomask flatness must not change when a pellicle is affixed. However, photomask flatness often changes when a pellicle is affixed thereto. There are several factors that give rise to photomask flatness changes upon affixing of a pellicle, but the most relevant, as is uncovered by the inventor, is the flatness of the pellicle frame.

Conventional pellicle frames generally are made of aluminum alloy. Pellicle frames, the size of which is usually determined by the specifications for exposure devices, have a width of about 150 mm, a length of about 110 to 130 mm and a thickness of about 2 mm, and have a shape with an opening in a central region. Generally, pellicle frames are manufactured by cutting a plate of aluminum alloy into the pellicle frame shape, or extrusion molding of aluminum alloy material into the pellicle frame shape.

Generally, a pellicle frame has a flatness of about 20 to 80 μm, which is very poor compared to several μm flatness of photomask surface, and in the case where a pellicle that uses a pellicle frame having such a poor flatness is affixed to a photomask, the unevenness of the pellicle frame transfers to the photomask, and the photomask deforms. During affixation, the pellicle is pressed onto the photomask with a large force of about 196 to 392 N (20 to 40 kgf); and it is thought that the deformation of the pellicle frame becomes level during the pressing. However, upon completion of the pressing, the pellicle frame seeks to return to its original shape; but as the pellicle frame is bonded onto the photomask surface, it unfortunately causes the photomask to also deform at the same time.

Therefore, investigations are being made for improving the flatness of the pellicle frame to reduce the deformation of the pellicle frame and thereby reduce the deformation of the photomask during the pellicle affixation; but inherently with an aluminum alloy pellicle frame, it is difficult to manufacture one having good flatness.

However, in the case where the material of the pellicle frame is changed to a material softer than aluminum, i.e., a material having a smaller elastic modulus, for example, a resin material, the deformation of the photomask can be reduced. In other words, in the case where a pellicle that uses a pellicle frame including a material having a small elastic modulus, is affixed to a photomask, even in the case where the pellicle frame deforms during the pellicle affixation, the material has a small elastic modulus, and therefore the stress of the deformation (restoration) of the pellicle frame becomes smaller. As a result, the photomask deformation is reduced.

However, for a pellicle frame using a material of such a small elastic modulus, the elastic modulus is reduced not only in the direction perpendicular to the pellicle film but also in the direction parallel thereto. During the affixation of the pellicle film to the pellicle frame, in the case where the elastic modulus of the pellicle frame is small in the direction parallel to the pellicle film, i.e., the pellicle frame is soft, the pellicle frame unfortunately may warp toward the interior due to the tension of the pellicle film. This result also occurs for pellicle frames hitherto made of aluminum; but aluminum pellicle frames are hard, and therefore the extent of warp toward the interior can be, in actuality, ignored.

Furthermore, pellicles generally are handled by grasping the exterior of the pellicle frame; but in the case where the pellicle frame is soft, the pellicle frame unfortunately distorts during the handling, and inconvenient pellicle film sagging occurs.

DISCLOSURE OF INVENTION

The present invention, in consideration of the circumstances recited above, is directed to reduce pellicle frame distortions due to the tension of a pellicle film and caused during handling, thereby providing an excellent pellicle frame capable of reducing the distortion of a photomask due to a pellicle affixation.

The present invention is a pellicle frame used for semiconductor lithography wherein the frame consists of a plurality of layers of which at least one layer has a different elastic modulus.

It is preferable to: make the pellicle frame compositely of a layer having an elastic modulus of 10 GPa or smaller and of a layer having an elastic modulus of 50 GPa or greater; join these layers of the pellicle frame in a direction perpendicular to the pellicle film face; laminate such that layers having a large elastic modulus form the outermost layers; or reverse this lamination structure.

According to the present invention, pellicle frame distortions due to the tension of the pellicle film and caused during handling can be reduced, thereby providing an excellent pellicle frame capable of reducing the distortion of a photomask due to a pellicle affixation.

BEST MODE FOR CARRYING OUT THE INVENTION

In the case where a pellicle frame having an elastic modulus in a direction parallel perpendicular to the pellicle film face smaller than the elastic modulus in a direction parallel to the pellicle film face, i.e., a pellicle frame that is soft in the direction perpendicular to the pellicle film face and hard in the direction parallel thereto, is used, the pellicle frame distortions due to the tension of the pellicle film and caused during handling can be reduced, thereby reducing the distortion of the photomask due to the pellicle affixation.

To obtain a pellicle frame having different hardness in the perpendicular direction and the horizontal direction, two or more types of thin plate frames made of materials having a different elastic modulus may be joined parallel to the pellicle film face. Specific methods include the following methods.

A thin plate frame, which is defined as a second group of layers in the specification, is affixed, such that a wider direction is parallel to a pellicle film, onto an upper surface and/or a lower surface of a base frame, which is defined as a first group of layers. The base frame is made of a material having an elastic modulus of 10 GPa or smaller and having a dimension in a direction parallel to a pellicle film face equal to that of a frame size and a dimension in a direction perpendicular to the pellicle film face equal to or less than that of the frame size. The thin plate frame is made of a material having an elastic modulus of 50 GPa or greater and a thickness of not greater than a half of the width of the frame.

Alternatively, one or more thin plate frame is fixedly arranged, such that a wider direction is parallel to a pellicle film, between two base frames made of a material having an elastic modulus of 10 GPa or smaller and having a dimension in a direction parallel to a pellicle film face equal to that of a frame size, the thin plate frame being of a material having an elastic modulus of 50 GPa or greater and a thickness of not greater than a half of the width of the frame. By such a configuration, the elastic modulus may be given an anisotropic property.

For each of these cases, the proportion of the material having a small elastic modulus is increased, the softness of the pellicle frame in the direction perpendicular to the pellicle film is ensured, and the thin plate made of a material having a large elastic modulus is joined to the material having a small elastic modulus in a direction parallel to the pellicle film, thereby enabling a larger elastic modulus in the direction parallel to the pellicle film.

A resin such as, for example, polyethylene resin, Teflon resin, ABS resin, polycarbonate resin, polypropylene resin, etc. may be used as the material having an elastic modulus of 10 GPa or smaller in each of these cases. Furthermore, aluminum, stainless steel, etc. may be used as the material having an elastic modulus of 50 GPa or greater.

Moreover, a bonding agent may be used to join the materials having a different elastic modulus. For example, acrylic bonding agents, silicone bonding agents, etc. may be used; and it is preferable to use a so-called elastic bonding agent having elasticity after the hardening as well. Alternatively, joining by injection molding and the like is also possible.

EXAMPLES

Hereinafter, the present invention is described specifically by examples, but the present invention is not limited only to the following examples.

First Example

A pellicle frame was manufactured by joining a thin plate frame of aluminum alloy (elastic modulus of 69 GPa) having outer dimensions of 149 mm×122 mm, inner dimensions of 145 mm×118 mm, a width of 2 mm, and a thickness of 0.5 mm to a base frame made of polycarbonate resin (elastic modulus of 2.4 GPa) having outer dimensions of 149 mm×122 mm, inner dimensions of 145 mm×118 mm, a width of 2 mm, and a thickness of 4 mm by a silicone bonding agent.

One end face of the polycarbonate resin side of the pellicle frame was applied with a photomask adhesive, and another end face of the aluminum alloy side was applied with a film bonding agent. Then, the film bonding agent side was affixed to a pellicle film held on an aluminum alloy frame, the film of the outer circumference of the pellicle frame was trimmed, and the pellicle was completed.

Affixing the pellicle film to the pellicle frame caused the center of a long side of the pellicle frame to warp toward the interior. Measurement of the pellicle frame outer dimensions in the vicinity of the center of the long side of the pellicle showed a warp toward the interior of 100 µm, although with no sag of the film.

The completed pellicle was affixed by a load of 20 kg to a 142 mm square photomask having a flatness of 0.2 µm. Then, measurement of the flatness of the photomask, now with the pellicle attached, showed a value of 0.2 μm, with no change in the photomask flatness.

Second Example

A pellicle frame was manufactured by joining two thin plate frames of aluminum alloy (elastic modulus of 69 GPa) having outer dimensions of 149 mm×122 mm, inner dimensions of 145 mm×118 mm, a width of 2 mm, and a thickness of 0.1 mm, one to the upper surface and the other to the lower surface of a base frame made of chlorotrifluoroethlyene resin (elastic modulus of 2 GPa) having outer dimensions of 149 mm×122 mm, inner dimensions of 145 mm×118 mm, a width of 2 mm, and a thickness of 4 mm by a silicone bonding agent.

One end face of the pellicle frame was applied with a photomask adhesive, and another end face was applied with a film bonding agent. Then, the film bonding agent side was affixed to a pellicle film held on an aluminum alloy frame, the film of the outer circumference of the pellicle frame was trimmed, and the pellicle was completed.

Measurement of the pellicle frame outer dimensions in the vicinity of the center of the long side of the pellicle showed a warp toward the interior of 80 μm, although with no sag of the film.

The completed pellicle was affixed by a load of 20 kg to a 142 mm square photomask having a flatness of 0.2 μm. Then, measurement of the flatness of the photomask, now with the pellicle attached, showed a value of 0.2 μm, with no change in the photomask flatness.

Third Example

A pellicle frame was manufactured by fixedly arranging a thin plate frame of aluminum alloy (elastic modulus of 69 GPa) having outer dimensions of 149 mm×122 mm, inner dimensions of 145 mm×118 mm, a width of 2 mm, and a thickness of 0.5 mm in between two base frames made of polycarbonate resin (elastic modulus of 2.4 GPa) having outer dimensions of 149 mm×122 mm, inner dimensions of 145 mm×118 mm, a width of 2 mm, and a thickness of 2 mm and joining the thin plate thereupon by a silicone bonding agent.

One end face of the pellicle frame was applied with a photomask adhesive, and another end face was applied with a film bonding agent. Then, the film bonding agent side was affixed to a pellicle film held on an aluminum alloy frame, the film of the outer circumference of the pellicle frame was trimmed, and the pellicle was completed.

Measurement of the pellicle frame outer dimensions in the vicinity of the center of the long side of the pellicle showed a warp toward the interior of 100 μm, although with no sag of the film.

The completed pellicle was affixed by a load of 20 kg to a 142 mm square photomask having a flatness of 0.2 μm. Then, measurement of the flatness of the photomask, now with the pellicle attached, showed a value of 0.2 μm, with no change in the photomask flatness.

Fourth Example

A pellicle frame was manufactured by an injection molding method using polycarbonate resin (elastic modulus of 2.4 GPa), which is eventually shaped into a frame form having outer dimensions of 149 mm×122 mm, inner dimensions of 145 mm×118 mm, a width of 2 mm, and a thickness of 4.5 mm and including, in its innermost position, a thin plate frame of aluminum alloy (elastic modulus of 69 GPa) having outer dimensions of 149 mm×122 mm, inner dimensions of 145 mm×118 mm, a width of 1.8 mm, and a thickness of 0.5 mm.

One end face of the pellicle frame was applied with a photomask adhesive, and another end face was applied with a film bonding agent. Then, the film bonding agent side was affixed to a pellicle film held on an aluminum frame, the film of the outer circumference of the pellicle frame was trimmed, and the pellicle was completed.

Measurement of the pellicle frame outer dimensions in the vicinity of the center of the long side of the pellicle showed a warp toward the interior of 120 μm, although with no sag of the film.

The completed pellicle was affixed by a load of 20 kg to a 142 mm square photomask having a flatness of 0.2 μm. Then, measurement of the flatness of the photomask, now with the pellicle attached, showed a value of 0.2 μm, with no change in the photomask flatness.

Comparison Example

One end face of a pellicle frame made of polycarbonate resin (elastic modulus of 2.4 GPa) having outer dimensions of 149 mm×122 mm, inner dimensions of 145 mm×118 mm, a width of 2 mm, and a thickness of 4.5 mm was applied with a photomask adhesive; and another end face was applied with a film bonding agent. Then, the film bonding agent side was affixed to a pellicle film held on an aluminum alloy frame, the film of the outer circumference of the pellicle frame was trimmed, and the pellicle was completed.

Measurement of the pellicle frame outer dimensions in the vicinity of the center of the long side of the pellicle showed a warp toward the interior of 300 μm, and sagging of the film occurred.

The completed pellicle was affixed by a load of 20 kg to a 142 mm square photomask having a flatness of 0.2 μm. Then, measurement of the flatness of the photomask, now with the pellicle attached, showed a value of 0.2 μm, with no change in the photomask flatness.

INDUSTRIAL APPLICABILITY

The pellicle frame distortions due to the tension of a pellicle film and caused during handling can be reduced, thereby providing an excellent pellicle frame capable of reducing the distortion of a photomask due to a pellicle affixation; and therefore the industrial utility value is quite high in fields using semiconductor lithography.

What is claimed is:

1. A pellicle frame used for semiconductor lithography having an upper surface coated with an adhesive layer and a lower surface coated with another adhesive layer bearing a release layer, said pellicle frame comprising three or more gas-impermeable plate layers, not counting adhesive and release layers, arranged in parallel to the upper surface of the frame, wherein at least one of said plate layers has an elastic modulus different from at least one of the other plate layers so that said pellicle frame is more elastic in the direction perpendicular to the upper surface of the frame than in the direction parallel thereto.

2. A pellicle frame of claim 1, wherein the frame consists of a first group of plate layers having an elastic modulus of 10 GPa or smaller and a second group of plate layers having an elastic modulus of 50 GPa or greater, said second group of plate layers having a combined thickness of not greater than a half of the width of the fram;

which is a distance between an inner wall and an outer wall of the frame.

3. A pellicle frame of claim 2, wherein the frame consists of three plate layers, and the first group plate layers are an uppermost plate layer and a lowermost plate layer and the second group plate layers are a single plate layer between said uppermost plate layer and said lowermost plate layer.

4. A pellicle frame of claim 2, wherein the frame consists of three plate layers, and the second group plate layers are an uppermost plate layer and a lowermost plate layer and the first group plate layers are a single plate layer between said uppermost plate layer and said lowermost plate layer.

* * * * *